United States Patent [19]

Jones

[11] Patent Number: 5,420,521
[45] Date of Patent: May 30, 1995

[54] BURN-IN MODULE

[75] Inventor: Elmer R. Jones, North Reading, Mass.

[73] Assignee: EJ Systems, Inc., Lawrence, Mass.

[21] Appl. No.: 34,788

[22] Filed: Mar. 19, 1993

Related U.S. Application Data

[63] Continuation-in-part of Ser. No. 967,148, Oct. 27, 1992, Pat. No. 5,315,240.

[51] Int. Cl.6 .......................... G01R 31/02; H05B 1/02
[52] U.S. Cl. .................... 324/760; 165/80.4; 219/209; 219/450
[58] Field of Search ............ 324/158 F, 73.1, 501, 324/158 R, 158 P, 760; 219/209, 210, 450, 516; 165/80.2, 80.3, 80.4

[56] References Cited

U.S. PATENT DOCUMENTS

| | | | |
|---|---|---|---|
| 5,164,661 | 11/1992 | Jones | 324/158 F |
| 5,172,049 | 12/1992 | Kiyokawa et al. | 324/158 F |
| 5,278,495 | 1/1994 | Beaton et al. | 324/158 F |

*Primary Examiner*—Ernest F. Karlsen
*Attorney, Agent, or Firm*—Samuels, Gauthier & Stevens

[57] ABSTRACT

A temperature controller to accurately control the temperature of a device under test (DUT) including a heat exchanger in heat exchange relationship with the DUT. A temperature sensor is received within the heat exchanger and is thermally isolated therefrom. This temperature sensor measures the temperature of the DUT. A second temperature sensor is received within the heat exchanger and measures the temperature of the heat exchanger. The temperature of the DUT is based on temperature readings from both of the sensors.

14 Claims, 4 Drawing Sheets

BURN-IN MODULE

CROSS-REFERENCE TO RELATED APPLICATION

This application is a continuation-in-part application of U.S. Ser. No. 07/967,148, filed 27 Oct. 1992, now U.S. Pat. No. 5,315,240.

BACKGROUND OF THE INVENTION

This invention relates to a burn-in module having a heat exchanger for control of the heat generated by the power applied to a device under test (DUT).

Integrated circuits (ICs), after manufacture and prior to use in a computer system, undergo a variety of tests to ensure that they are defect free and will perform as intended. One of the tests conducted is known as burn-in.

Test systems for component testing are well know; for example, semi-conductor life tests in burn-in chambers are common. The process of burning-in typically consists of applying a load to the components being tested at elevated temperatures. This allows for identification of weak or faulty components and thus precludes their ultimate use, such as in a computer system.

In addition to burn-in ovens or hot air ovens, other technologies used for this purpose are open loop conduction heating, such as hot plates and thermal probes and liquid bath systems.

The burn-in ovens are by far the most prevalent test device and method used. Second in importance are the liquid burn-in bath methods.

In order to apply a load to the components under test, driver electronics, which must be isolated from the hot thermal environment of the high temperature oven or liquid bath, are used. This means that the driver electronics must be some distance from the devices under test (DUTs) which compromises frequency limits. Further, DUT trays must be constructed with an expensive high temperature material which adds to the costs of the testing procedure. The burn-in ovens, or forced air systems, typically have plus or minus 3° C. gradients throughout the chamber as required by MIL-STD-883. However, device heat dissipation makes determining the actual case temperatures (and therefore, junction temperatures) very difficult. Materials used in the chamber must be rated at the highest operating temperature, i.e. sockets, capacitors, resistors, connectors and PC board material. Semi-conductors cannot be used on the PC board above 75° C. because of their unreliability at these temperatures. High frequency applications (approximately 5 mHz) require the use of multi-layer polyimide, PCB's, mother boards, daughter boards and extender boards. High pin count devices require very high I/O's through chamber walls or a compromise must be made. Further, clock cards outside the chamber driving relatively long distances (typically as long as 30 inches) compromise the high frequency operation. In liquid bath systems, the problems are the same as in the burn-in ovens. Further, they are more expensive to operate, more inconvenient to operate and clock circuits cannot be put in the bath.

Briefly, some of the common problems with current technology is that the driver electronics are remote from the DUTs. This affects signal quality, the maximum signal frequency that can be used and results in signal skew, cross talk and overshoot. The I/O through the oven walls is not especially suitable for high pin count VLSI components and there is a practical limit to the number of I/O's and the possibility of impairment of signal quality. Perhaps the most severe problem is that there are temperature variations throughout the oven due to flow dynamics and one is never really sure of the actual DUT junction temperature. Further, the large monolithic ovens are not amenable to small lot burn-in, independent temperature cycling or independent DUT cool down under bias.

My prior inventions, see U.S. Pat. Nos. 5,164,661 and 5,126,656, comprised a thermal control system and a tower for burn-in of DUTs which accurately and independently controlled the device case temperature of each DUT with close-loop conductive heating and further included over temperature protection, under temperature protection and junction temperature correction. Using a close-loop method of conductive heating for each DUT, the prior inventions could heat the device case temperature to say 200° C. at an accuracy of less than plus or minus 2° C. The inventions used closed-loop sensors that read temperatures directly from the device case assuring that the DUT at each DUT position reached the desired temperature. A conductive module which included a heater and a sensor engaged the DUT. Therefore, a separate heat source serviced each position. Thermal control for each position was via a dedicated microprocessor with the processor set up in turn by a computer. With individual control, each position could be heated to different temperatures over different time intervals. Also, the sensor which read the temperature of the DUT was isolated from the heater which contacted the DUT. Therefore, the temperature reading was not influenced by the temperature of the heater. Further, the sensor and heater were individually suspended whereby uniform engagement with the DUT was ensured.

The system was preferably embodied in a tower-like structure where each position was located on the outer surface of the structure. The conductive module was secured to the outer surface of the tower, its heater and sensor extending outwardly. The DUT socket releasably engaged the conductive module at the DUT position. Mother boards containing the DUT clock card with driver electronics were arrayed vertically in the tower in a wall-like configuration and communicated with lower horizontally-fixed backplanes secured in the tower. These backplanes distributed the DC voltages to the mother boards which in turn distributed the load to the DUT's. Thermal control boards communicated with upper backplanes which backplanes were secured horizontally in the tower. These boards controlled the DUT device case temperature. The control board communicated with a microprocessor via the upper backplane.

The conductive modules were secured to the tower and passed through the mother board. The conductive modules were computer controlled by the thermal control boards. The DUT sockets frictionally engaged the mother board and electrically communicated therewith. The DUT contacted a sensor on the conductive module. Because the driver electronics were placed close to the DUT, the system provided signal quality greater than 40 mHz.

My prior inventions overcame the significant prior art problems as discussed above. However, as the DUT's being tested become more sophisticated and greater demands were placed on the testing of these components, it was found that with my prior system the power loads were such that the heat being generated could not be easily dissipated while maintaining the precise temperature control desired for testing. Also, it was discovered that there was a need for a much smaller system embodying the temperature control concept of my prior inventions and more specifically, a system for a single DUT, such as a portable system with a single DUT.

In the present invention, structural and functional changes have been made to my prior system to provide for a heat exchange fluid to be used in combination with a thermoconductive assembly, referred to in my patents as a conductive module. In a preferred embodiment, the heat exchange system maintains the thermoconductive assembly at a desired temperature while the temperature control of the DUT functions based on the DUT temperature sensor and the temperature sensor in the heating block.

Broadly the invention comprises a system for temperature control of a thermoconductive assembly used in the burn-in of a DUT. In a preferred embodiment, the heat exchange unit functions independently of the DUT temperature sensor which is received within the heat exchange device and the heating block temperature sensor as described in my patents.

In a preferred embodiment of the invention, the heat exchange fluid is used to remove heat from the thermoconductive assembly.

In an alternative embodiment of the invention, the heat exchanger functions in combination with the DUT temperature sensor and the heating block temperature sensor to control both the temperature of the thermoconductive assembly and the DUT.

BRIEF DESCRIPTION OF THE DRAWING(S)

DESCRIPTION OF THE PREFERRED EMBODIMENT(S)

My invention will be described with reference to a specific DUT, temperature ranges, driver electronics, etcetera. It is to be understood that my system is applicable to the testing of any components or materials where precise temperature control is required.

Figure 1:
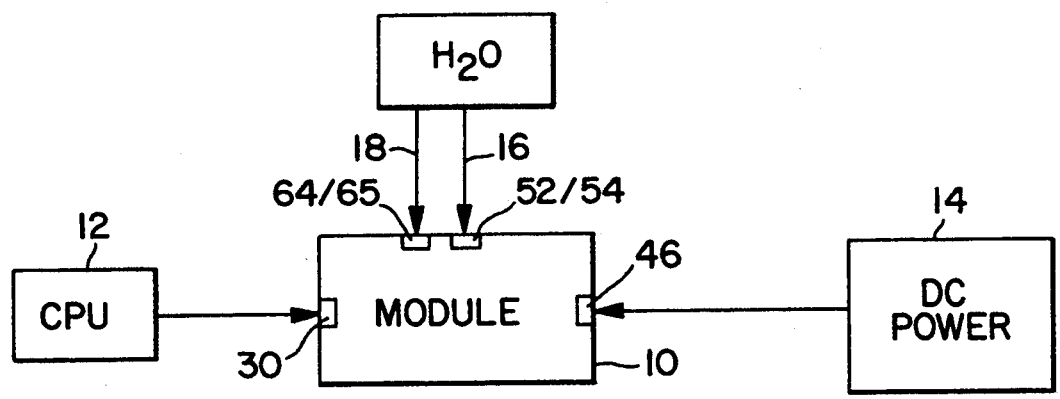
FIG. 1 is a block diagram of a module of the invention in combination with peripheral components.

Referring to FIG. 1, a module embodying the invention is generally shown at 10 together with associated peripheral components; namely a CPU 12, a source of DC voltage 14, a first heat exchange fluid source 16 and a second heat exchange fluid source 18. The first heat exchange source 16 provides heat exchange fluid for a heat sink and the second heat exchange source provides heat exchange fluid for a manifold assembly.

Figure 2:
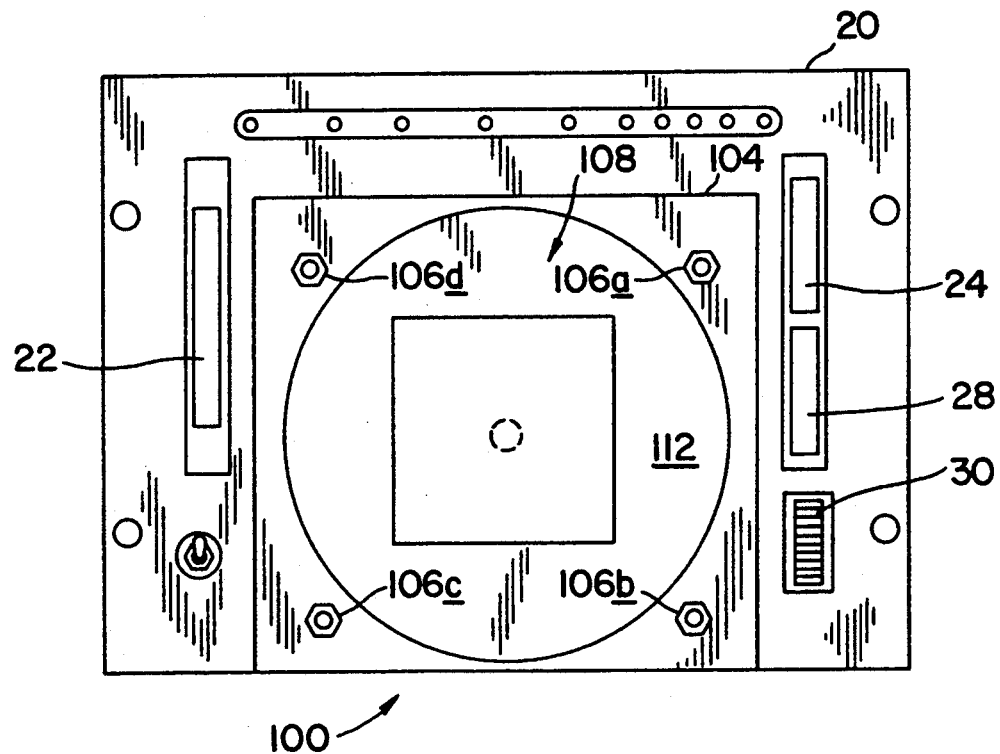
FIG. 2 is a front view of the module.

Referring to FIG. 2, the module 10 is shown and comprises a face plate 20 having various connectors received therein. Specifically, there is a DUT power connector 22 to provide communication between the power and the driver electronics of a socket assembly; a control I/O connector 24 which is an address buss (eight lines) which communicates with a control board 34 (see FIG. 3) to send serial data to and from the driver electronics of the socket assembly; a thermal connector 28 in which three pairs of wires from the thermoconductive assembly are received, specifically from the DUT temperature sensor, from the temperature sensor in the heating block and from the heating element. This connector 28 communicates with a thermal control board 36 (see FIG. 3). A CPU connector is shown at 30. A thermoconductive assembly is shown generally at 100 and will be described in more detail in reference to FIGS. 6, 7 and 8.

Figure 3:
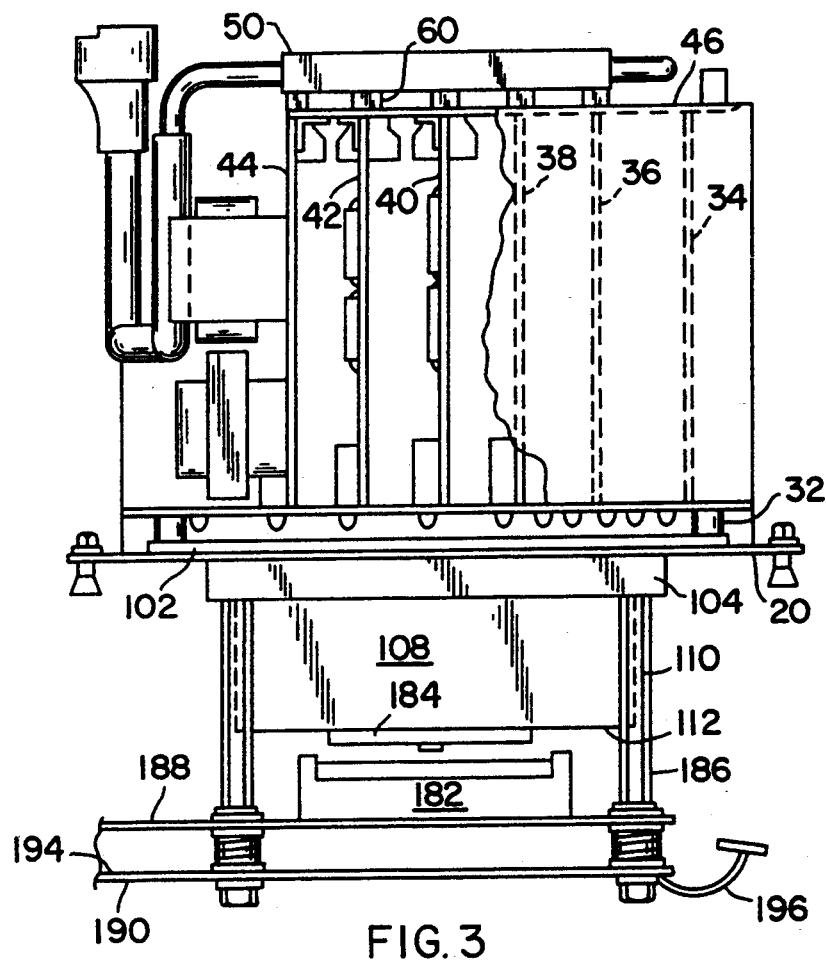
FIG. 3 is a plan view of the module.

Referring to FIG. 3, a backplane 32 communicates with the just described connectors and one end each of a control board 34, a thermal control board 36, three voltage regulator boards 38, 40 and 42 and a power/communications board 44. The voltage regulator boards 38, 40 and 42 are also electrically and physically joined at their other ends to a DC voltage buss board 46. The control board 34 controls the voltage regulator boards 38, 40 and 42 and the driver electronics on the socket assembly. The voltage regulator boards are optional and are tailored for the user's requirements, although a typical combination could be −5 volts, +5 volts and +12 volts. The thermal control board controls, via computer input, the DUT temperature and the solenoid valves V-1, V-2 and V-3 of the manifold. The power/communications board powers and provides for communication among the various boards. The computer is capable of addressing 256 different modules, although only one module is shown here for purposes of illustration. The control and communications boards 34 and 44 physically connect to the board 46.

Figure 4:
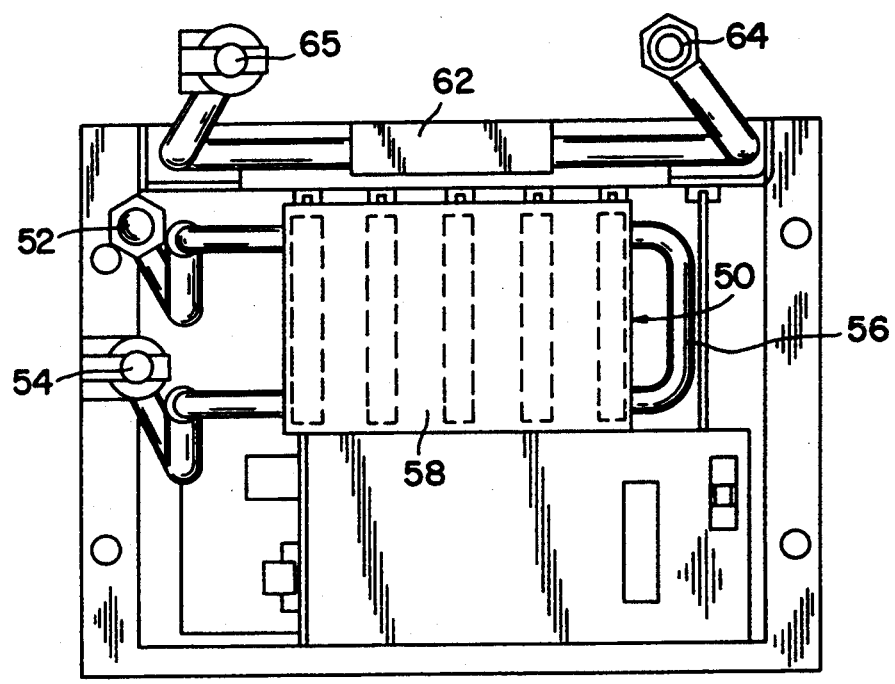
FIG. 4 is a rear view of the module.

Referring to FIG. 4, in heat exchange relationship with the board 46 is a heat sink 50. The heat sink 50 comprises an inlet 52, an outlet 54 connected to a first source of heat exchange fluid 16, specifically water, and includes a copper tube 56 formed in an aluminum block 58.

A manifold assembly 62 comprises an inlet 64 and an outlet 65. This assembly 62 is shown in greater detail in FIG. 6.

Figure 5:
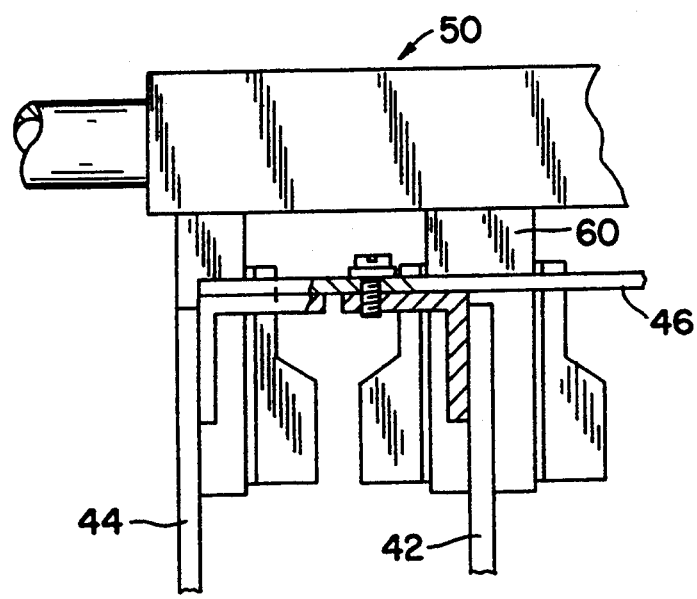
FIG. 5 is an expanded cross-sectional view of a heat sink used to remove heat from the module.

Referring to FIG. 5, the connections of the boards 42 and 44 to the board 46 are shown in greater detail. The heat transfer between the board 46 and the heat sink 50 is effected by interposing thermally conductive elongated rectangular columns 60 between the heat sink 50 and the board 46.

Figure 6:
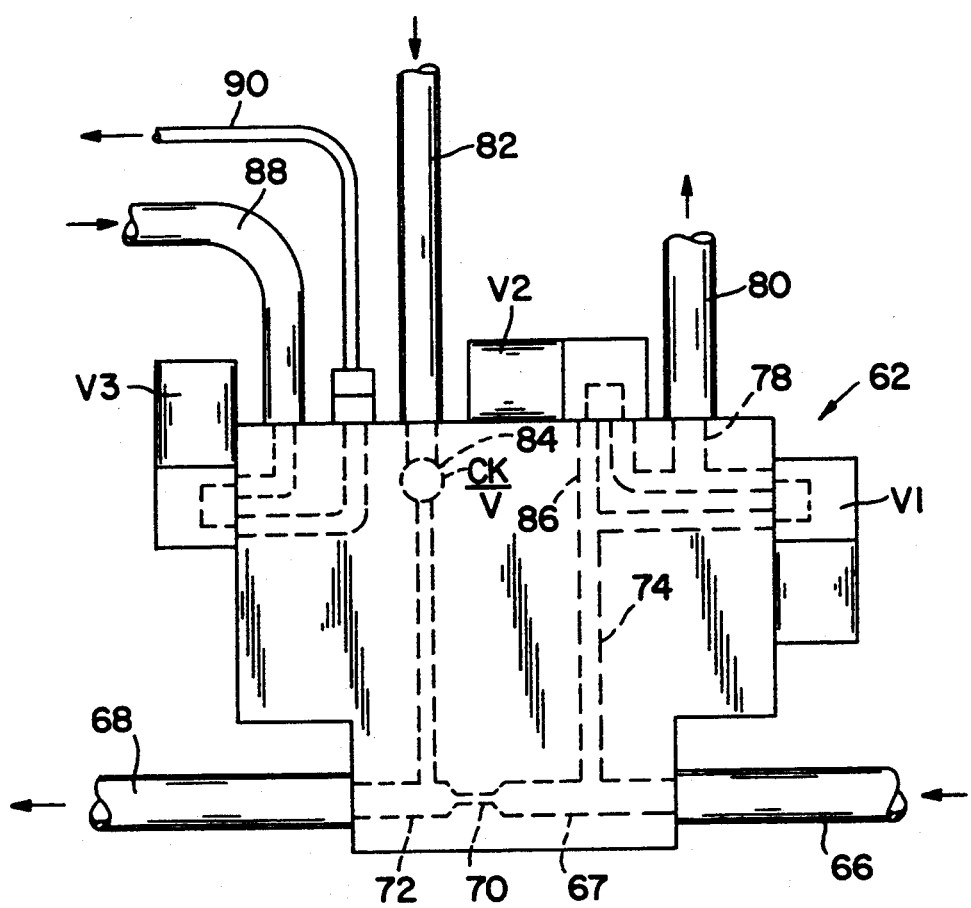
FIG. 6 is a schematic view of a manifold assembly for the flow of heat exchange fluid to the thermoconductive assembly.

Referring to FIG. 6, the manifold assembly 62 controls the flow of heat exchange fluid (water) to the thermoconductive assembly 100. It comprises an inlet conduit 66 and an outlet conduit 68 joined to the manifold 62. The inlet conduit 66 communicates with a channel 67 where the water flows through an orifice restrictor 70 and into a downstream channel 72 to the outlet conduit 68. The discharge of the water results in a pressure drop in the channel 72. More importantly, it results in a zone of lower pressure for reasons hereinafter described. A channel 74 which is upstream of a solenoid control valve V-1 provides for the flow of water to the control valve V-1. When the control valve V-1 is open, the water flows through the valve and into the channel 78. After flowing through the channel 78, it flows into the conduit 80 and through a coil 134 in the thermoconductive assembly 100. It returns from the thermoconductive assembly 100 via a conduit 82, through a check valve 84 and into the channel 72 of lower pressure and is discharged through the outlet conduit 68. If additional cooling water is needed for the thermoconductive assembly 100, the solenoid valve V-2, is opened allowing additional water to flow through a channel 86, into the channel 78 and to the thermoconductive module 100.

The flow rates of the water through the conduits 80–82 are relevantly low. If the water flowed continuously, the valve orifices would be very small, i.e. the diameter of a human hair and they would tend to clog easily. The water is delivered by continually or preferably continuously pulsing uniformly the valves V-1 and V-2 (where required). This results in the ability to use valves with larger orifices to avoid clogging. The water is discharged in drop-like form from the valves. Thus, air is entrapped in the water downstream of the valves V-1 and V-2. The zone of lower pressure (channel 72) ensures fluid flow through the channel 78, conduit 80 and conduit 82 because upstream of the valves V-1 and V-2 is a head or zone of higher pressure.

An exemplary pressure difference between the zones can be 9 psig. Water continuously flows through the conduit 66, the channel 67, the restricted orifice 70, the channel 72 and the discharge conduit 68. This maintains the zone of lower pressure at all times. The check valve prevents flow of the water into the conduit 82.

The conduits, gallons/minute valves and channels, for the preferred embodiment, are configured such with the valve V-1 opened, a pulsed flow rate through the cooling coil in the thermoconductive assembly can be between 0.01 to 1.0 gallons/minute (gpm) with the duration of the ON/OFF being 0.02 to 1.0 seconds. A typical temperature range for the water can be between 5° C. to 90° C. and this can remove 0 to 350 BTU/min. If the valve V-2 is open, the pulsed flow rate through the conduit 80 can double and the number of BTU/minute removed can be doubled.

A typical continuous flow rate through the channel 68 and orifice 70 can be 0.02 to 0.10 gpm.

Figure 8:
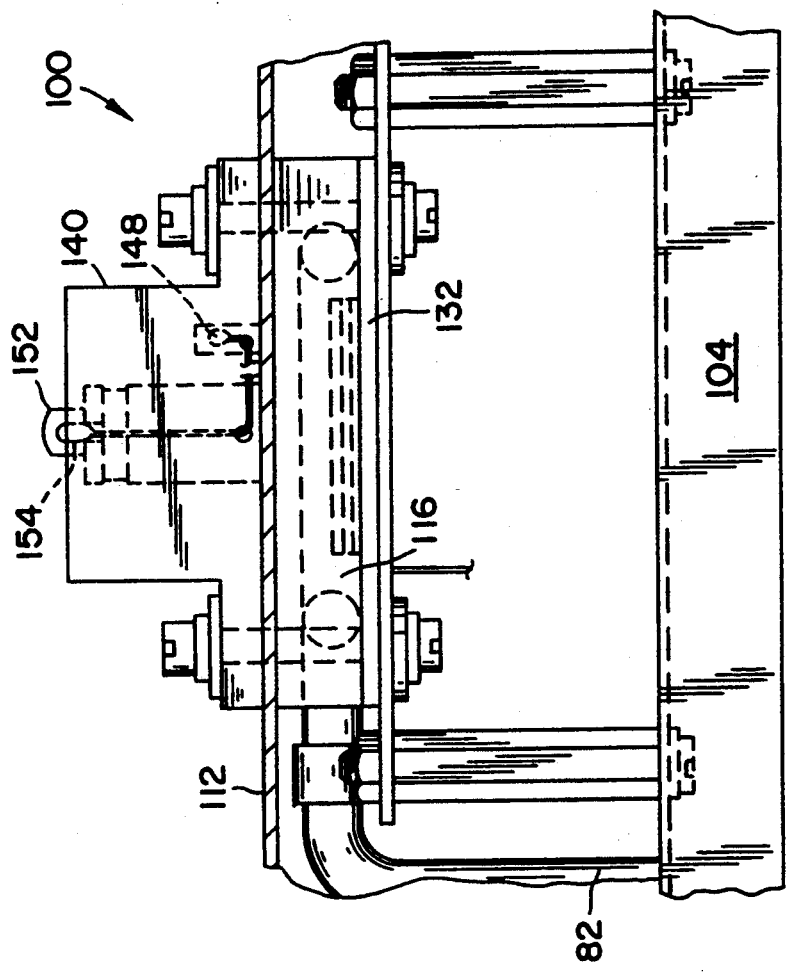
FIG. 8 is a sectional view of the thermoconductive assembly.
Figure 7:
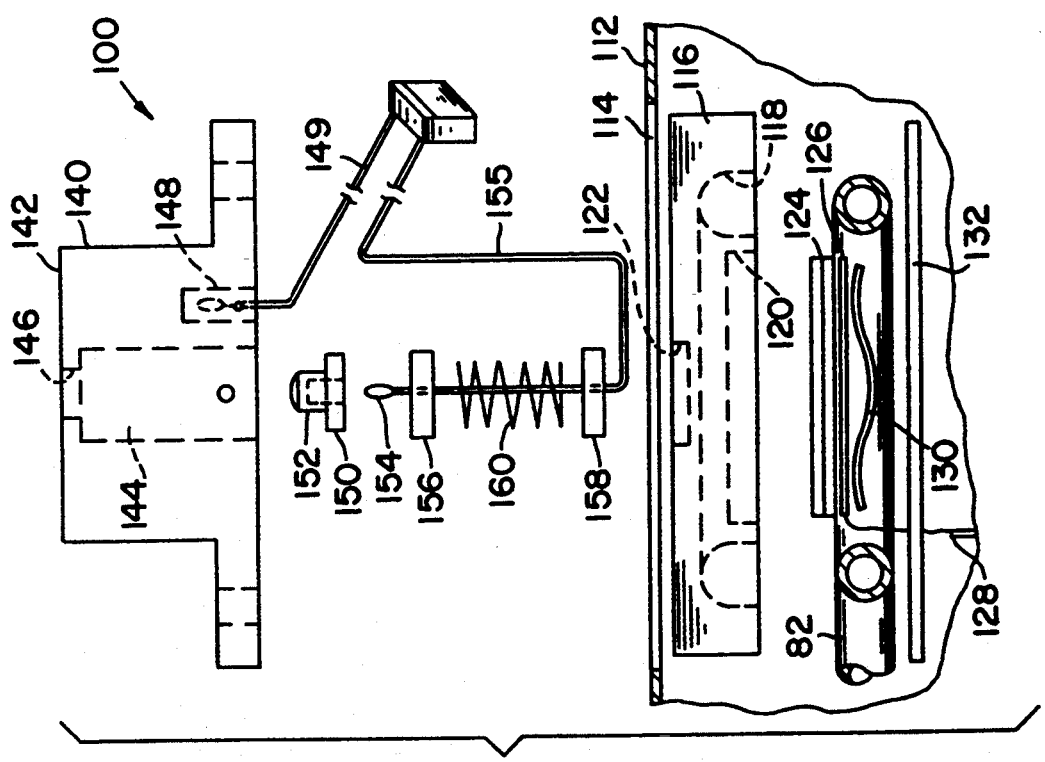
FIG. 7 is an exploded view of a thermoconductive assembly.

The thermoconductive assembly 100, shown in FIGS. 2 and 3 and in greater detail in FIGS. 7 and 8, comprises a support plate 102 secured to the module 10. Secured to the support plate 102 is a rectangular-shaped base 104. The base is characterized by four apertures 106a, 106b, 106c and 106d into which the socket assembly is secured as will be described. The base 104 is hollow and comprises four outer walls and a top surface. One of the walls has an opening for the passage of the three-pairs of wires therethrough (see FIG. 2). Secured to the base 104 is a disk-like, hollow housing 108 having a circular outer wall 110 and a top surface 112 characterized by a central rectangular aperture 114. An aluminum block 116 is received within the housing 108 in register with the central aperture. The aluminum block 116 is characterized on its underside by a circular groove 118. Within the circular groove 118 is formed a rectangular recess 120. The top surface of the aluminum block 116 is characterized by a circular recess 122. A heater assembly 124 is received within the rectangular recess 122. A heating element 126 abuts the heating assembly and has a pair of wires 128 extending therefrom. Underlying the heating element 126 is a wave washer 130 and abutting the wave washer is a heater backup plate 132. The heater backup plate 132 is secured to the base 104. The heater assembly 124 is a sandwiched aluminum conductor. The heating element 126 is a thin film resistance heater. A copper tube 134 (only the inlet conduit shown, the outlet conduit disposed behind the inlet conduit when viewed in FIGS. 7 and 8) is received in the groove 118 to achieve maximum heat transfer between the block 116 and the tube 134.

A heating element 140 includes a facing surface 142 and is characterized by central aperture 144. The central aperture 144 is reduced at 146. A thermister 148 is secured in the heating block 140. A pair of wires 149 are joined to the thermister. A DUT sensor 150 is received in the apertures 144 and 146. The DUT sensor includes an extending reduced portion 152 which extends through the opening 146. The diameter of the extended portion 152 is slightly less than the diameter of the opening 146 to allow for a gimbal-like movement. A thermister 154 is secured in the DUT sensor 150. A pair of wires 155 are joined to the thermister 154. Insulating disks 156 and 158 are spaced apart by a spring 160. The spring biases the sensor 150 outwardly. The disk 158 is secured in the recess 122 of the aluminum block 116.

As shown in FIG. 8 the heating element 140, the block 116, the tube 134, the heater assembly 124, the heating element 126, the wave washer 130 and the heater backup plate 132 are sandwiched and secured together.

Referring to FIG. 3, a DUT socket assembly 180 is shown and comprises a socket 182 having a DUT 184 received therein. Pins 186 (only two shown) are received in the apertures 106a–106d. The socket 182 is secured to a support board 188 and is spaced apart from a driver board 190 by springs 192 (four springs, one for each leg). The driver board 190 carries the driver electronics for the DUT. A cable 194 connects the board 190 to the board 188. A cable 196 connects the board 190 to the connector 22 (see FIG. 2).

Operation

The operation of the invention will be described with reference to the burn-in of a specific device, i.e. an IC. As described in the aforementioned patents and patent application, when a specific type of device is to be tested, a temperature profile of the device is first established. The IC 184 to be tested is inserted into the socket 182. The socket assembly 180 is brought into engagement with the thermoconductive unit 100. The locator pins 186 are inserted into the sockets 106a–106d of the base 104. The sensor 152 contacts the center of the IC such that the face of the sensor 152 is flush with the surface of the IC. The flush contact is ensured by the ability of the sensor 152 to move within the heating block 140. The face 142 of the heating block 140 is also placed into contacting engagement with the case of the IC and is flush with the surface of the case. This is possible because the gimbal-like movement of the socket assembly 180.

The following illustrative parameters are entered into the CPU through the keyboard in response to screen prompts.

1. Select thermal module to be enabled
2. Enter temperature at which device is to be tested
3. Enter maximum and minimum temperatures (±°C.)
4. Enter duration of tests
5. Enter temperature steps
6. Enter time steps
7. Enter DUT power dissipation
8. Enter DUT + JC (Optional)

9. Enter pulse rate of heat exchange fluid

The table is a typical heater set up screen.

| HEATER SET UP SCREEN - TEMPERATURE CYCLING ENABLED SET UP PARAMETERS FOR HEATER 1 2 3 4 5 6 7 8 9 10 11 12 13 14 15 16 | | | | | | | |
|---|---|---|---|---|---|---|---|
| HEATER STATE | LOGGED ON | | CHIP TEMP (°C.) | TIME HHHM::MM) | | CHIP TEMP (°C.) | TIME HHHH:MM) |
| HEATER CONTROL | ENABLED | STEP 1: | 35 | 0:10 | 16: | 125 | 0:30 |
|  |  | STEP 2: | 45 | 0:20 | 17: | 115 | 0:30 |
| OVR TEMP DELTA: | 10 | STEP 3: | 55 | 0:30 | 18: | 105 | 0:30 |
| IN RANGE ± °C.: | 3 | STEP 4: | 65 | 0:40 | 19: | 95 | 0:30 |
| TEMP CYCLING: | ENABLED | STEP 5: | 75 | 0:50 | 20: | 85 | 0:30 |
| NUMBER STEPS: | 25 | STEP 6: | 85 | 1:00 | 21: | 75 | 0:30 |
| NUMBER CYCLES: | 1 | STEP 7: | 95 | 1:10 | 22: | 65 | 0:30 |
|  |  | STEP 8: | 105 | 1:20 | 23: | 55 | 0:30 |
|  |  | STEP 9: | 115 | 1:30 | 24: | 45 | 0:30 |
| CASE STYLE: | CERAMIC | STEP 10: | 125 | 1:40 | 25: | 35 | 0:30 |
| COMPENSATE JC: | DISABLED | STEP 11: | 135 | 1:50 |  |  |  |
| DUT POWER (MW): | 500 | STEP 12: | 145 | 2:00 |  |  |  |
| DEVICE JC: |  | STEP 13: | 155 | 2:10 |  |  |  |
|  |  | STEP 14: | 145 | 1:00 |  |  |  |
|  |  | STEP 15: | 135 | 1:00 |  |  |  |

In the exemplary heater set-up screen shown above there is provided an optional function + JC. With this +JC function disabled, the user will have displayed and/or printed out temperatures, i.e. 65° C., corresponding to 'case temperatures' as the device case terminology with which the industry is familiar. However, as discussed above the temperature displayed and/or printed out is the actual junction temperature, i.e. 65° C. printed out is the actual junction temperature, i.e. 65° C.

The parameter DEVICE + JC refers to the manufacturer's rating of the device, which is a function of the thermal resistance from the junction of the DUT to the case surface.

If the user wishes to measure junction temperature directly, + JC is enabled and the manufacturers rated value, i.e. 15, is input. This value is informational and is displayed and/or printed out. Also, the user will have displayed and/or printed out the set temperature as a junction temperature, i.e. 65° C.

The pulse rate of the water flowing through the tube 134 is selected based on the manufacturer's specification. Knowing the power applied translates into the number of BTU's to be removed per unit time. The number and duration of the pulses for the opening and closing of the valve V-1, and the valve V-2 where necessary, are entered into the CPU. The thermal control board 36 communicates with the valves V-1, V-2 and V-3 to effect their opening and closing as determined by the computer input.

Although described with reference to a heat sink having water flowing therethrough to remove the heat from the various cards, depending upon the specific device being tested, it may be possible to use a finned assembly to remove heat or it may be that no heat sink is required at all.

In the practice of the invention, the flow rates for the heat exchange fluid for the conductive module will, of course, vary depending upon the amount of heat to be removed. The flow of the heat exchange fluid, although described as pulsed, may also be continuous. Depending upon the materials of construction, i.e. the composition of the insulating material, thickness of the wall of the copper tubing and the heat exchange surface, it is well within the skill of the art to determine the optimum flow rates. The preferred embodiment has been described in reference to the temperature sensor and heater block sensor controlling the temperature of the DUT as described in the parent application. It is within the scope of this invention that the power to the heating element remain constant and that the flow rate through the heat exchanger be controlled both to remove the excess heat generated by the power applied to the DUT and to control in combination with the temperature sensor and heating block sensor the temperature of the DUT.

The flow of the water through the heat sink is fixed and continuous. Knowing the temperature that will be generated in the module 10 and the BTU to be removed, a flow rate is determined, i.e. 0.2 to 1.0 gpm for removing 0–350 BTU/minute.

After all parameters have been entered, a designated function key is pressed to start burn-in. This activates the boards and associated heaters to apply load to the DUT. The temperature sensed during a cycle is based on the readings from the sensor. If this reading violates the preset temperature range, the temperature of the heating block as read by the sensor is raised or lowered and the power to the heating element 140 is increased or decreased. The temperature in the heating block 142 is controlled in response to temperature readings taken by the thermister 148. The case temperature of the DUT is read by the sensor 150. When the case temperature of the DUT violates a preset value, the temperature of the heating block is increased or decreased by the increasing or decreasing power to the heating element.

Monitoring information corresponding to the actual test conditions in the form of print outs, screen displays, graphics and/or text is desirable; error signals for manual or automatic disabling of a position(s) and the application of the load applied to the DUT by the driver electronics has not been described in detail because it is all well within the skill of the art.

The applied heat flows by conduction from the heating block through the DUT, and thereafter back to the sensor. As previously described, the gimbal construction of the sensor 150 ensures flush contact between the heating block to the DUT and the DUT to the sensor. As a practical matter, this construction eliminates air between the surfaces which would normally create an additional thermal resistance. The temperature profile of the case of the DUT will normally be different from the known temperature profile of the heating block. Also, the DUT may experience heat losses to ambient.

All of the above contribute to the losses between the temperature applied to the DUT case and the temperature which the junction achieves.

In effect, the process allows the user of the system to set a desired temperature range for the heat to be applied to the DUT junction, which in turn involves setting the heating block to an appropriate level so that the desired junction temperature is achieved. The actual temperature of the DUT case is sensed by sensor and adjustments are made by increasing or decreasing the temperature of the heating block. In light of the heating block temperature being monitored, and under normal conditions knowing the temperature profiles of the heating block and the DUT with the expected losses to ambient, the sensed temperature of the DUT case is converted to a reading corresponding to the desired DUT junction temperature. This temperature value in turn is displayed to the user of the system.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A system for temperature control of a device(s) under test (DUT) which comprises:
    a socket assembly including at least one socket for a DUT;
    a thermoconductive unit adapted to engage the socket assembly and in communication with the DUT, the unit comprising:
        a first heat-exchange device in heat transfer relationship with the DUT;
        a second heat exchange device in heat transfer relationship with the first heat exchange device;
        a DUT temperature sensor received within the first heat exchange device and thermally isolated from the first heat exchange device to measure the temperature of the DUT;
        a temperature sensor received within the first heat exchange device to measure the temperature of the first heat exchange device;
        means to control the temperature of the first heat exchange device with the second heat exchange device;
    means to indirectly control the temperature of the second heat exchange device with a heat exchange fluid comprising;
        means to define a heat exchange surface in the second heat exchange device; and
        means to flow a heat exchange fluid across the surface as a pulsed stream.

2. A method for temperature control of a device under test (DUT) wherein the DUT is received in a socket assembly and a thermoconductive unit engages the DUT which comprises:
    placing a first heat-exchange device in a heat transfer relationship with the DUT;
    controlling the temperature of the DUT;
    placing a second heat exchange device in heat exchange relationship with the first heat exchange device;
        controlling the temperature of the first heat exchange device with the second heat exchange device;
        controlling the temperature of the second heat exchange device by flowing therethrough a heat exchange fluid; and
        flowing the heat exchange fluid as a pulsed stream.

3. The system of claim 1 wherein the means to define the heat exchange surface comprises:
    a heat exchange chamber.

4. The system of claim 3 which comprises:
    a manifold assembly;
    a first conduit and a second conduit to introduce and discharge the heat exchange fluid into and from the manifold assembly;
    a third conduit to flow the heat exchange fluid from the manifold assembly into the heat exchange chamber; and
    a fourth conduit to flow the heat exchange fluid from the heat exchange chamber and into the manifold.

5. The system of claim 4 which comprises:
    at least one inlet channel in the manifold to place the first and third conduits in fluid flow communication.

6. The system of claim 5 wherein the inlet channel comprises:
    a first direct channel having a direct valve and a second bypass channel having a bypass valve.

7. The system of claim 6 which comprises a discharge channel in the manifold to place the second and fourth conduits in fluid flow communication.

8. The system of claim 7 which comprises:
    means to control the opening and closing of the valves to effect the pulsed flow of the heat exchange fluid.

9. The system of claim 8 wherein the manifold comprises:
    a through channel having a restricted orifice therein, which through channel places the first conduit and the second conduit in fluid flow communication, and places the upstream end of the through channel in fluid flow communication and the downstream end of the through channel in fluid flow communication with the discharge channel, and which restricted orifice creates a zone of relatively lower pressure downstream of the discharge channel.

10. The method of claim 2 which comprises:
    creating a zone of lower pressure downstream of the heat exchange chamber to enhance the fluid flow through the chamber.

11. The system of claim 1 which includes:
    a heat sink secured to the system in heat transfer relationship.

12. The system of claim 11 which includes:
    means to flow a heat exchange fluid through the heat sink.

13. The system of claim 1 wherein the heat exchange fluid is water droplets.

14. The method of claim 2 wherein the heat exchange fluid flowing through the second heat exchange device comprises a plurality of water droplets.

* * * * *